United States Patent
Menke et al.

(10) Patent No.: US 7,356,718 B2
(45) Date of Patent: Apr. 8, 2008

(54) SEMICONDUCTOR MEMORY CIRCUIT AND METHOD FOR OPERATING THE SAME IN A STANDBY MODE

(75) Inventors: Manfred Menke, Wolfratshausen (DE); Esther Vega-Ordonez, München (DE)

(73) Assignee: Infineon Technologies AG, Munich (DE)

(*) Notice: Subject to any disclaimer, the term of this patent is extended or adjusted under 35 U.S.C. 154(b) by 479 days.

(21) Appl. No.: 11/032,535

(22) Filed: Jan. 10, 2005

(65) Prior Publication Data

US 2005/0179461 A1    Aug. 18, 2005

(30) Foreign Application Priority Data

Jan. 10, 2004   (DE) .................. 10 2004 001 577

(51) Int. Cl.
*G06F 1/26* (2006.01)
(52) U.S. Cl. .............. 713/320; 713/300; 713/323; 713/324; 713/330; 365/226; 323/271
(58) Field of Classification Search ......... 713/500, 713/323, 300, 324, 330, 320; 365/227, 226; 323/271
See application file for complete search history.

(56) References Cited

U.S. PATENT DOCUMENTS

| | | | | |
|---|---|---|---|---|
| 4,395,675 A | * | 7/1983 | Toumani | 323/271 |
| 4,683,382 A | * | 7/1987 | Sakurai et al. | 327/544 |
| 6,133,779 A | | 10/2000 | Sichert et al. | |
| 6,163,225 A | | 12/2000 | Sundaram et al. | |
| 6,560,157 B2 | * | 5/2003 | Sugita et al. | 365/226 |
| 6,646,894 B2 | * | 11/2003 | Hong et al. | 363/21.01 |
| 7,042,278 B2 | * | 5/2006 | Ikoma et al. | 327/538 |
| 2004/0083397 A1 | * | 4/2004 | Chen | 713/320 |

FOREIGN PATENT DOCUMENTS

DE    198 32 309 C1   10/1999

OTHER PUBLICATIONS

German Patent Office Examination Report dated Sep. 9, 2004.

* cited by examiner

*Primary Examiner*—Thomas Lee
*Assistant Examiner*—Malcolm D Cribbs
(74) *Attorney, Agent, or Firm*—Patterson & Sheridan, L.L.P.

(57) ABSTRACT

A semiconductor memory circuit having a controller by means of which the semiconductor memory circuit can be switched into a standby mode with a reduced power requirement, comprises an analog subcircuit having a power input and a signal output and is characterized by the fact that a switching device for feeding electrical power is connected to the power input and the controller is connected to the switching device in such a way that the switching device can be driven by the controller in such a way that the switching device, in the standby mode, supplies the analog subcircuit with electrical power during a first periodically repeated time duration and does not supply it with electrical power during a second periodically repeated time duration.

17 Claims, 3 Drawing Sheets

SEMICONDUCTOR MEMORY CIRCUIT AND METHOD FOR OPERATING THE SAME IN A STANDBY MODE

CROSS-REFERENCE TO RELATED APPLICATIONS

This application claims foreign priority benefits under 35 U.S.C. §119 to co-pending German patent application number DE 10 2004 001 577.5-55, filed 10 Jan. 2004. This related patent application is herein incorporated by reference in its entirety.

BACKGROUND OF THE INVENTION

1. Field of the Invention

The present invention relates to a semiconductor circuit having a controller by means of which the semiconductor memory circuit can be switched into a standby mode with a reduced current consumption, and to a method for operating a semiconductor memory circuit in a standby mode with a reduced current consumption.

2. Description of the Related Art

Integrated semiconductor memory circuits can often be operated in a standby mode in which, on the one hand, they perform no functions or only a reduced number of functions and, on the other hand, they also have only a reduced current consumption or power requirement, and from which they can be put into an operation mode with unrestricted functionality at any time within a minimum time duration. Primarily in the case of mobile devices that are supplied with electrical power by batteries or accumulators, this standby mode is important to minimize the average power requirement and to maximize the service time with a battery or accumulator charge. This is all the more important as, on the one hand, these mobile devices, for example mobile telephones, organizers, etc., or at least many components thereof are or can be often operated predominantly in a standby mode and, on the other hand, an ever more extensive functionality is integrated, which drives up the power requirement outside the standby mode.

By way of example, various portions of refresh circuits, leakage currents and supply currents for analog components contribute to the standby current or to the power requirement in the standby mode. For low-power applications or applications which are optimized for a low power requirement, leakage currents can be reduced in part by means of circuit technology or by means of technological parameters that have been rendered less stringent. The power requirement of refresh circuits can be kept small by optimizing the partitioning, in particular by bit lines that are as short as possible.

Therefore, there is a need for a semiconductor memory circuit and a method for operating a semiconductor memory circuit which has a reduced power requirement in a standby mode.

SUMMARY OF THE INVENTION

One embodiment of the present invention provides a semiconductor memory circuit having a controller by means of which the semiconductor memory circuit can be switched into a standby mode with a reduced power requirement, having an analog subcircuit having a power input and a signal output, wherein a switching device, for feeding electrical power, is connected to the power input. The controller is connected to the switching device in such a way that the switching device can be driven by the controller in such a way that the switching device, in the standby mode, supplies the analog subcircuit with electrical power during a first periodically repeated time duration and does not supply it with electrical power during a second periodically repeated time duration.

One embodiment of the present invention further provides a method for operating a semiconductor memory circuit having an analog subcircuit in a standby mode with a reduced power requirement, comprising the following steps:
a) the analog subcircuit is supplied with electrical power during a first time duration; and
b) the analog subcircuit is not supplied with electrical power during a second time duration,
wherein steps a) and b) are periodically repeated.

Embodiments of the present invention are based on the insight that the power requirement of analog circuits or subcircuits cannot be chosen to be arbitrarily small since otherwise this adversely affects the speed or the accuracy. The lower the power requirement of an analog circuit is, the worse generally the parameters of the individual circuit components can be defined. This leads to a deterioration of the matching behavior, to a greater variation or range of variation of the properties of the analog circuit and to an ever poorer simulatability thereof. Furthermore, as the power requirement decreases and as currents decrease, the sensitivity to radiated interference or external electromagnetic interference becomes greater. On the other hand, the proportion of the power requirement that is made up by the analog subcircuits has a more than proportional effect particularly in the case of semiconductor memory circuits with a small proportion of the overall power requirement that is made up by the refresh circuits.

One example of an analog subcircuit is a voltage generator. Since current-consuming units that are supplied with a voltage and electrical power by the voltage generators are generally approximately of the same size largely independent of the size of the memory, the voltage generators provided for the standby mode are also dimensioned independently of the memory size. The power requirement of the voltage generators is thus essentially independent of the memory size. Therefore, particularly in the case of a small memory size, the lower limit of the power requirement of a memory circuit in the standby mode is essentially determined by analog circuit parts of the generators. Since, on the other hand, out of consideration for low-power requirements or on account of the need for a low power requirement, the supply voltages are also low, relatively large inaccuracies of the analog components cannot be permitted.

The same applies correspondingly not only to voltage generators but also to other analog subcircuits, for example amplifiers, repeaters, comparators, etc., or more precisely, both to semiconductor memory components that form autonomous modules and to memories that are integrated with other semiconductor circuits, for example, processors, on a common semiconductor substrate.

Embodiments of the present invention are based on the idea of reducing the average power requirement of an analog subcircuit of a semiconductor memory circuit by virtue of said analog subcircuit being supplied with electrical power in a clocked fashion rather than continuously. By way of example, the analog subcircuit is supplied with electrical power for only 3 μs periodically every 30 μs. The average power requirement of the analog subcircuit is thus reduced by approximately 90% compared with a continuous power supply. The dimensioning of the analog subcircuit is thus subject to smaller restrictions with regard to the power requirement than without clocking. The analog subcircuit can thus readily be optimized with regard to optimum operating properties. In particular, the analog subcircuit has a low sensitivity toward radiated interference or coupling in of electromagnetic interference without consideration for a low power requirement in the active operating mode. Furthermore, the parameters of the individual components and of the entire analog subcircuit can be determined better and have a smaller range of variation. The matching behavior and the simulatability of the analog subcircuit in the design stage are also improved as a result.

The switching-on and switching-off currents that occur or are to be applied when the power supply for the analog subcircuit is switched on and off and the associated power spikes may be regarded, in this case, as small in relation to the total power requirement in the standby mode. The average power requirement is therefore reduced by a factor that corresponds rather precisely to the duty ratio. The duty ratio is the ratio between the time duration in which the analog subcircuit is supplied with power and the period of the switch-on and switch-off cycle.

In accordance with embodiments of the present invention, the power requirement is thus reduced not by means of a corresponding design of the analog subcircuit but rather by means of a clocking of its power supply. This clocking, by its nature, gives rise to a periodic fluctuation or a ripple in the output voltage (EN) of the analog subcircuit. However, said ripple can be minimized, for example, by means of blocking capacitances that are already present conventionally in part at the signal outputs of the analog subcircuit or else by optimizing the same or by means of additional low-pass filters (RC elements, etc.). By varying the size of the blocking capacitances, it is possible to establish an optimum between reducing the power requirement in the standby mode and the ripple. In this case, the blocking capacitances have only an insignificant influence on the chip size since they are generally already present and, moreover, scale with the current values in the standby mode, which are very small, however. By means of blocking capacitances or other low-pass filters, it is also possible in part to smooth internal node voltages within the analog subcircuit, as a result of which a possible ripple on said voltages can also be kept almost arbitrarily small.

The ripple on an output voltage of an analog subcircuit is also dependent on the current that flows to a subcircuit connected downstream or is drawn from the latter. Therefore, the ripple may be virtually completely reduced through skillful clocking by coordinating the clocking of a plurality of subcircuits connected in series.

One important further advantage of the present invention is that it may be easily integrated into existing circuits or be inserted in the case of the analog subcircuits thereof since only switching transistors have to be arranged at the power inputs of the analog subcircuits. Sensitive analog components have neither to be modified nor even to be added. In this case, the ripple is reduced by the low-frequency noise component up to the switching-on/off frequency.

BRIEF DESCRIPTION OF THE DRAWINGS

Preferred exemplary embodiments of the present invention are explained in more detail below with reference to the accompanying figures, in which.

DETAILED DESCRIPTION OF THE PREFERRED EMBODIMENT

Figure 1:
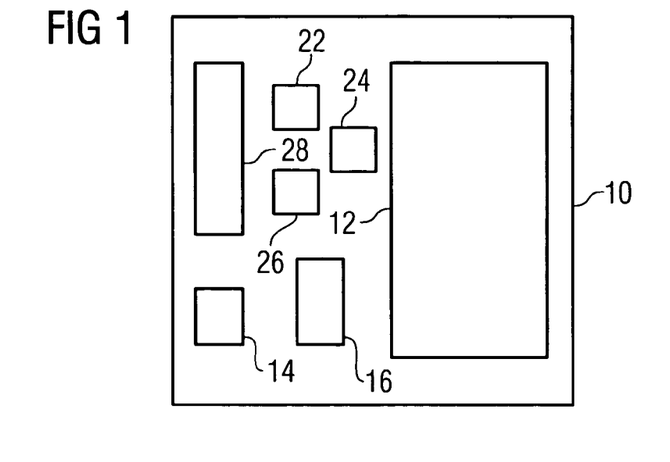
FIG. 1 shows a schematic illustration of a semiconductor memory circuit in accordance with an exemplary embodiment of the present invention.

FIG. 1 is a schematic illustration of a semiconductor memory circuit 10 having a memory cell array 12 (or an array of memory cells) and an oscillator 14 for generating a time signal for controlling a refresh circuit 16 for refreshing memory cells of the memory cell array 12. Furthermore, the semiconductor memory circuit 10 comprises a first subcircuit 22 (analog), a second subcircuit 24 (not necessarily analog), a third subcircuit 26 (analog) and a controller 28, which are illustrated in greater detail in FIG. 2. In the present exemplary embodiment, the first subcircuit 22 and the third subcircuit 26 are voltage generators for generating a reference voltage or some other input voltage for the second subcircuit 24. The second subcircuit 24 is a digital or analog subcircuit, for example, a receiver, an amplifier, a comparator, etc. Further subcircuits of the semiconductor memory circuit 10, in particular further voltage generators, amplifiers, repeaters, comparators, refresh circuits, etc., are not illustrated in FIG. 1 for the sake of clarity in the illustration.

Figure 2:
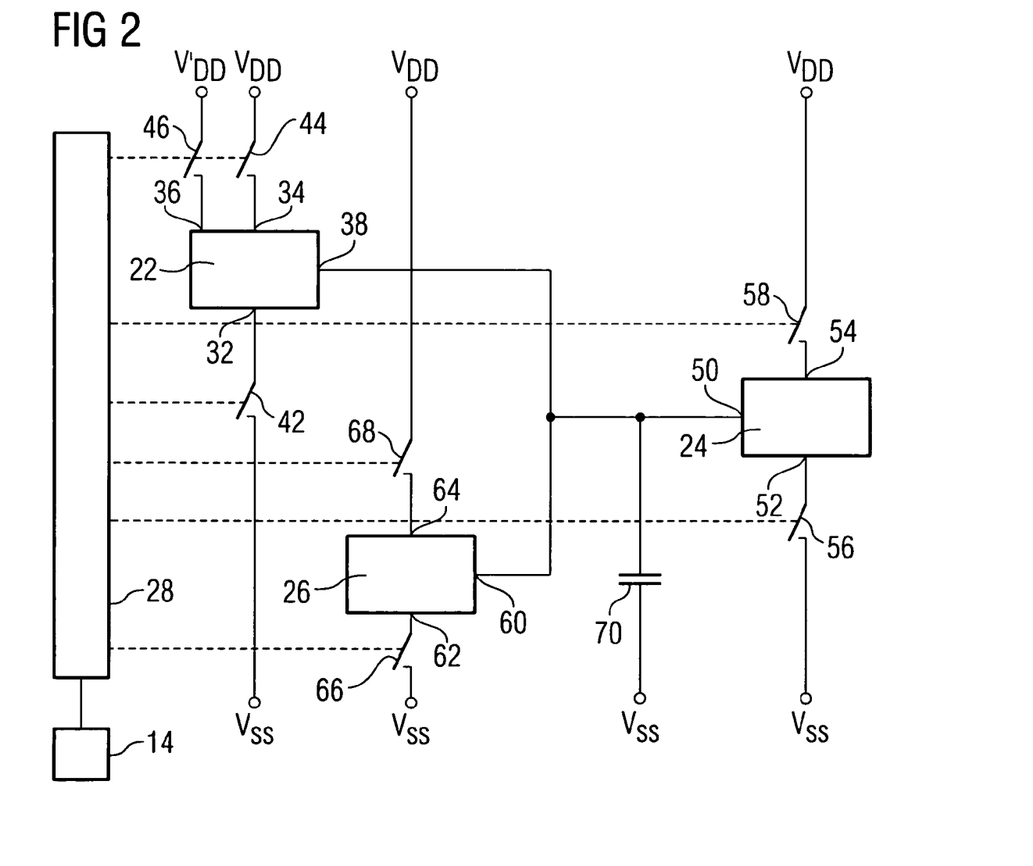
FIG. 2 shows a schematic illustration of a detail from the semiconductor memory circuit illustrated in FIG. 1.

FIG. 2 is a schematic circuit diagram illustrating the subcircuits 22, 24, 26, the controller 28, the oscillator 14 and their combination or circuitry interconnection. The first analog subcircuit 22 has terminals 32, 34, 36. The first terminal 32 and the second terminal 34 form a first power input, and the first terminal 32 and the third terminal 36 form a second power input of the first subcircuit 22. Furthermore, the first subcircuit 22 has a signal output 38. The first terminal 32 is connected to a reference potential $V_{SS}$ via a first switch 42. The second terminal 34 is connected to a first supply potential $V_{DD}$ via a second switch 44. The third terminal 36 is connected to a second supply potential $V_{DD}'$ via a third switch 46.

The first switch 42, the second switch 44 and the third switch 46 form a first switching device connected to the first power input 32, 34, 36 of the first subcircuit 22.

The second subcircuit 24 has a signal input 50 connected to the signal output 38 of the first subcircuit 22. Furthermore, the second subcircuit 24 has a fourth terminal 52 and a fifth terminal 54, which form a power input of the second subcircuit 24. The fourth terminal 52 is connected to the reference potential $V_{SS}$ via a fourth switch 56. The fifth terminal 54 is connected to the first supply potential $V_{DD}$ via a fifth switch 58.

The fourth switch 56 and the fifth switch 58 form a second switching device connected to the second power input 52, 54 of the second subcircuit 24.

The third analog subcircuit 26 has a second signal output 60, which is connected in parallel with the first signal output 38 of the first subcircuit 38 to the signal input 50 of the second subcircuit 24. Furthermore, the third subcircuit 26 has a sixth terminal 62 and a seventh terminal 64, which form a power input of the third subcircuit 26. The sixth terminal 62 is connected to the reference potential $V_{SS}$ via a sixth switch 66. The seventh terminal 64 is connected to the first supply potential $V_{DD}$ via a seventh switch 68.

The sixth switch 66 and the seventh switch 68 form a third switching device connected to the third power input 62, 64 of the third subcircuit 26.

The controller 28 is connected to the oscillator 14 to receive a time signal from the latter to control the switches 42, 44, 46, 56, 58, 66, 68 in response to the time signal.

The first signal output 38 of the first subcircuit 22, the second signal output 60 of the third subcircuit 26 and the signal input 50 of the second subcircuit 24 are further connected to the reference potential $V_{SS}$ via a blocking capacitance or a capacitor 70. The capacitor 70 forms, together with the output impedances of the first signal output 38 of the first subcircuit 22 and of the second signal output 60 of the third subcircuit 26, a low-pass filter for smoothing the output signal of the first subcircuit 22 and of the third subcircuit 26.

The switches 42, 44, 46, 56, 58, 66, 68 may be embodied as transistors, and particularly as field effect transistors. In this case, the first switch 42, the fourth switch 56 and the sixth switch 66 may be n-channel transistors, and the second switch 44, the third switch 46, the fifth switch 58 and the seventh switch 68 may be p-channel transistors. All of the p-channel transistors 44, 46, 58, 68, or alternatively all of the p-channel transistors 44, 46 which are assigned to the same subcircuit 22, are situated in a common n-type well, which is not switched, and is always connected to the first supply potential $V_{DD}$ or the second supply potential $V_{DD}'$.

The number of terminals of a power input of a subcircuit and the corresponding number of switches of a switching device via which the subcircuit can be connected to the power supply may amount to two, as in the case of the second subcircuit 24 and the third subcircuit 26, or else be higher or significantly higher, as in the case of the first subcircuit 22. In one embodiment, each internal reference potential node or supply potential node (or each important internal reference potential node or supply potential node) is connected to the corresponding reference potential or supply potential via a separate terminal and a separate switch. In this case, the reference potential or supply potential nodes can assume potentials that are independent of one another after the power supply has been switched off, as a result of which, the transient recovery process after the power supply has been switched on anew is significantly shortened. Selected important potential nodes (or all supply potential nodes) may be connected to the reference potential via blocking capacitances to retain their respective potentials as well as possible after the power supply has been switched off. Nodes of a subcircuit that are to be isolated internally are respectively disconnected from the drivers by means of transfer gates.

In the exemplary embodiment illustrated in FIG. 2, the supply potentials $V_{DD}$, $V_{DD}'$ may be identical or different from one another. Each subcircuit may be connected respectively to one or more reference and supply potentials depending on the number of terminals of its power input.

In this exemplary embodiment, the first, analog subcircuit 22 and the third, analog subcircuit 26 are voltage generators for generating an input voltage for the second subcircuit 24. In this case, the first subcircuit 22 is provided to generate the input voltage for the second subcircuit 24 when the semiconductor memory circuit 10 is in a standby mode. The third subcircuit 26 is provided to generate the input voltage for the second subcircuit 24 when the semiconductor memory circuit 10 is in an active operating mode with unrestricted functionality and thus outside the standby operating mode.

In the active operating mode, the controller 28 connects the third subcircuit 26 to the power supply, whereas it isolates the third subcircuit 26 from the power supply when the semiconductor memory circuit 10 is in the standby operating mode. In the standby mode, the controller 28 controls the first switching device 42, 44, 46 in such a way that the first subcircuit 22 is periodically connected to the power supply and isolated from the latter. By way of example, the first subcircuit 22 is connected to the power supply for 3 µs out of every 30 µs. This means that the first switch 42, the second switch 44 and the third switch 46 are periodically simultaneously closed for 3 µs and then all simultaneously open for 27 µs.

The controller 28 may be designed in such a way that it controls the first switching device 42, 44, 46 in such a way that, in the active mode, besides the third subcircuit 26, the first subcircuit 22 is also supplied with power in an uninterrupted manner.

The controller 28 controls the second switching device 56, 58 in such a way that the second subcircuit 24 is connected to the power supply in an uninterrupted manner in the active mode and in a periodically clocked manner in the standby mode similarly to the first subcircuit 22. The controller 28 may control the second switching device 56, 58 in the standby mode with the same period as the third switching device 42, 44, 46, but in such a way that the first subcircuit 22 and the second subcircuit 24 are not simultaneously connected to the power supply at any point in time. By way of example, within a period of 30 µs, firstly, the first subcircuit 22 is connected to the power supply within a time duration having a length of about 3 µs. Afterward, after a short pause of about 50 ns in which neither the first subcircuit 22 nor the second subcircuit 24 is connected to the power supply, the second subcircuit 24 is connected to the power supply for a duration of about 3 µs. During the remainder of the period with a length of almost 24 µs (i.e., 24 µs minus 50 ns), once again neither the first subcircuit 22 nor the second subcircuit 24 is connected to the power supply. While the first subcircuit 22 is not connected to the power supply, the potential at the first signal output 38 of the first subcircuit 22 and at the signal input 50 of the second subcircuit 24 is kept generally constant by the capacitor 70.

The just described power supply of the first subcircuit 22 and of the second subcircuit 24 with an offset clock or the non-overlapping power supply phases of the first subcircuit 22 and of the second subcircuit 24 ensure that the ripple of the first subcircuit 22 lies outside the active phase of the second subcircuit 24. This reliably prevents interference from building up.

For further analog components or subcircuits, it is possible, in order to simplify the circuit, to use the DISABLE test mode that is provided for each voltage generator, in order thus to de-energize each individual generator current. Changeover processes and possibly associated regulating transient recovery process may be rendered ineffective by (large) blocking capacitances as described. Said blocking capacitances are dimensioned in such a way that the small but continuously flowing load currents also do not lead to a significant ripple.

In the case of more than two subcircuits whose power supply is clocked in the standby mode, more than two different phases or clock phases for controlling the corresponding switching devices are also possible and advantageous. The switch-on phases depend on the slowest circuit part connected to the respective phase. This yields the number of phases as well as the assignment of the subcircuits to the clock phase.

In the basic conception, the number of clock phases can be reduced to three, namely two non-overlapping clock phases (as described above) and a clock phase that overlaps (e.g., complete overlap) these two clock phases. Within a signal chain comprising a plurality of subcircuits, the power supply thereof is respectively controlled alternately by the two non-overlapping clock phases. The third clock phase overlapping the other two clock phases provides the possibility of affording a lead so that internal signals can adjust themselves before the beginning of the second non-overlapping clock phase and the length of this clock phase can thus be kept short. With the third clock phase that overlaps the other two clock phases, it is thus possible to further optimize the compromise between permitted ripple and average power requirement in the standby mode. The power supply of a subcircuit (or of only a section of a subcircuit) is controlled by means of the third clock phase. By way of example, the power supply of the first subcircuit in FIG. 2 is controlled via the first terminal 32 and the second terminal 34 by means of the first clock phase, while the third switch 46 is controlled by means of the third clock phase.

The controller 28 receives trigger pulses or a time signal from the oscillator 14, which is already provided for controlling the refresh circuit 16 for refreshing the memory cells of the memory cell array 12. Consequently, since a dedicated oscillator or some other dedicated generator of a time signal can be dispensed with, an additional power requirement that impairs the current balance or the average power requirement in the standby mode is not generated. In this case, either the same trigger pulses as for the refreshing of the memory cells of the memory cell array 12 are used for clocking the power supply of the subcircuits 22, 24, as a result of which both processes take place synchronously or with a constant phase shift, or a control signal for clocking the power supply is derived from the trigger pulses provided for the refresh processes, said control signal having a higher or lower frequency.

After the power supply for the entire semiconductor memory circuit 10 has been switched on, a power-on sequence is executed or processed for a controlled build up of oscillations or transient recovery of all components of the semiconductor memory circuit 10 and all (internal) signal levels in a switch-on mode. In this switch-on mode, the controller 28 controls the switching devices in such a way that the subcircuits 22, 24, 26 are connected to the power supply, or are supplied with electrical power, continuously or in an uninterrupted manner rather than in a clocked manner. This ensures that no mutual influencing of the run-up of different internal operating states, potentials and levels leads to (mutual) interference or even to the semiconductor memory circuit not starting properly.

As already illustrated above with reference to FIG. 2, in the active mode, besides the voltage generators (third subcircuit 26) specifically provided for this active mode, the standby voltage generators (first subcircuit 22) provided for the standby mode are also operated, to be precise continuously and without clocking of the power supply. It is only if there is no external requirement for an active access to the semiconductor memory circuit 10 that the voltage generators provided for the active mode are switched off and the standby voltage generators provided for the standby mode are supplied with electrical power in a clocked manner.

In the case of dynamic memories (e.g., DRAM or dynamic random access memory) in which, as described above, the internal oscillator for controlling the refresh of the memory cells is used for the control of the clocked power supply, the internally controlled and proceeding refresh of the memory cells is not handled as an active access. Since the refresh is effected in a distributed manner, the resulting power requirement can be dealt with in the short term by the blocking capacitances. Enough time remains before the next refresh for the blocking capacitances to be recharged by the standby voltage generators and for the desired potentials to be re-established. This avoids the situation in which the activation of the voltage generators provided for the active mode, which have high parallel-path currents, nullifies the advantage of the clocked power supply in the standby mode.

Figure 3:
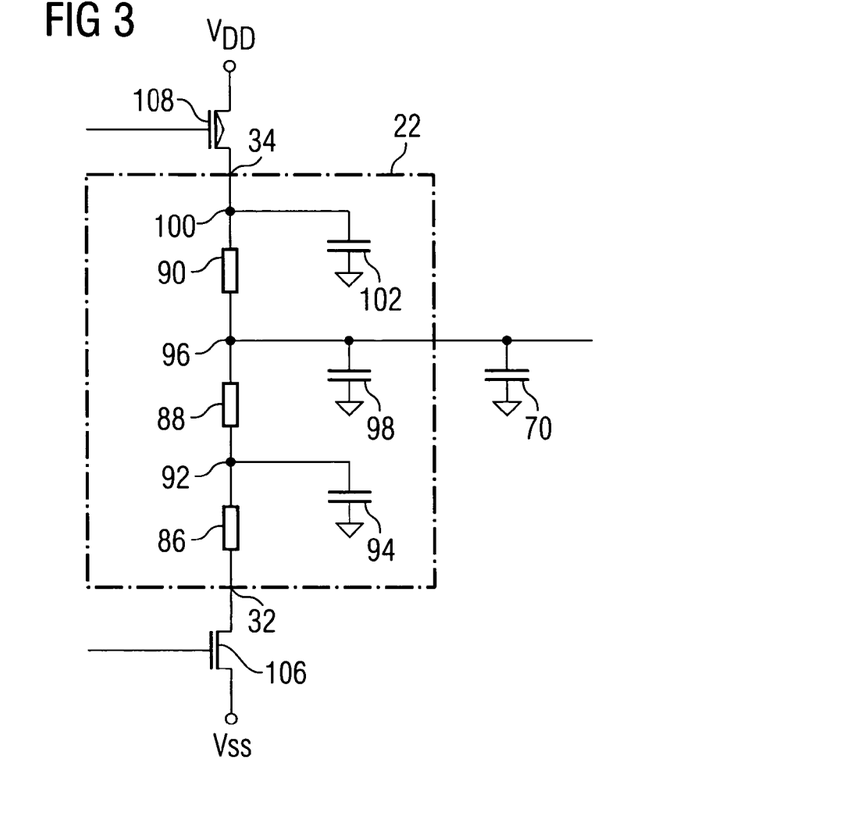
FIG. 3 shows a schematic circuit diagram of an analog subcircuit.

FIG. 3 is a schematic illustration of a simple example of an internal construction of the first analog subcircuit 22. In this case, the subcircuit 22 comprises a first terminal 32 and a second terminal 34, which together form a power input of the subcircuit 22.

A voltage divider comprising a series circuit of three resistors 86, 88, 90 is connected between the first terminal 32 and the second terminal 34. A first parasitic capacitance 94 exists between a first node 92 between the first resistor 86 and the second resistor 88, on the one hand, and the reference potential, on the other hand. A second parasitic capacitance 98 exists between a second node 96 between the second resistor 88 and the third resistor 90, on the one hand, and the reference potential, on the other hand. A third parasitic capacitance 102 exists between a third node 100 between the third resistor 90 and the second terminal 34, on the one hand, and the reference potential, on the other hand. The second node 96 is connected to the signal output 38. The signal output 38 is connected to ground via a blocking capacitance 70.

An n-channel field effect transistor 106 with the function of the switch 42 (in FIG. 2) is arranged between the first terminal 32 and the reference potential $V_{SS}$. A p-channel field effect transistor 108 with the function of the switch 44 (in FIG. 2) is arranged between the second terminal 34 and the supply potential $V_{DD}$. As illustrated above with reference to FIG. 2, the field effect transistors 106, 108 are switched by the controller 28 to connect the subcircuit 22 to the power supply or to isolate the subcircuit 22 from the power supply. The optimum in the design of the parasitic capacitances 94, 98, 102 is present if, after the transistors 108, 106 have been switched off, the voltage established at the node 96 corresponds to that present prior to the switch-off. This can be achieved by means of corresponding additional parasitic capacitances at the node 100 or 92.

Figure 4:
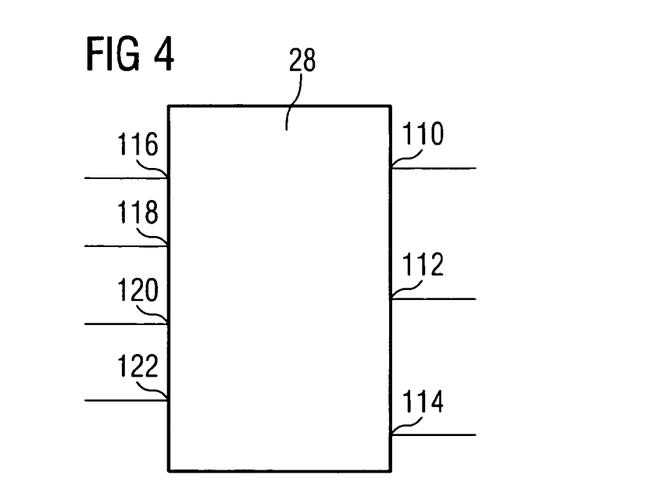
FIG. 4 shows a schematic illustration of a controller in accordance with one exemplary embodiment of the present invention.

FIG. 4 is a schematic illustration of a controller 28 similar to the controller used in the exemplary embodiment illustrated in FIG. 1. In a departure from the latter, the controller 28 illustrated in FIG. 4 has three control outputs 110, 112, 114, at which it provides, as illustrated above, two control signals with non-overlapping clock phases and a third control signal with a clock phase that overlaps the other two clock phases. At control inputs 116, 118, 120, 122, the controller 28 receives a trigger signal or time signal and other control signals which, by way of example, indicate a no-load operation of the semiconductor memory circuit 10, a standby state thereof or a run-up of the supply voltage (power-on).

Figure 5:
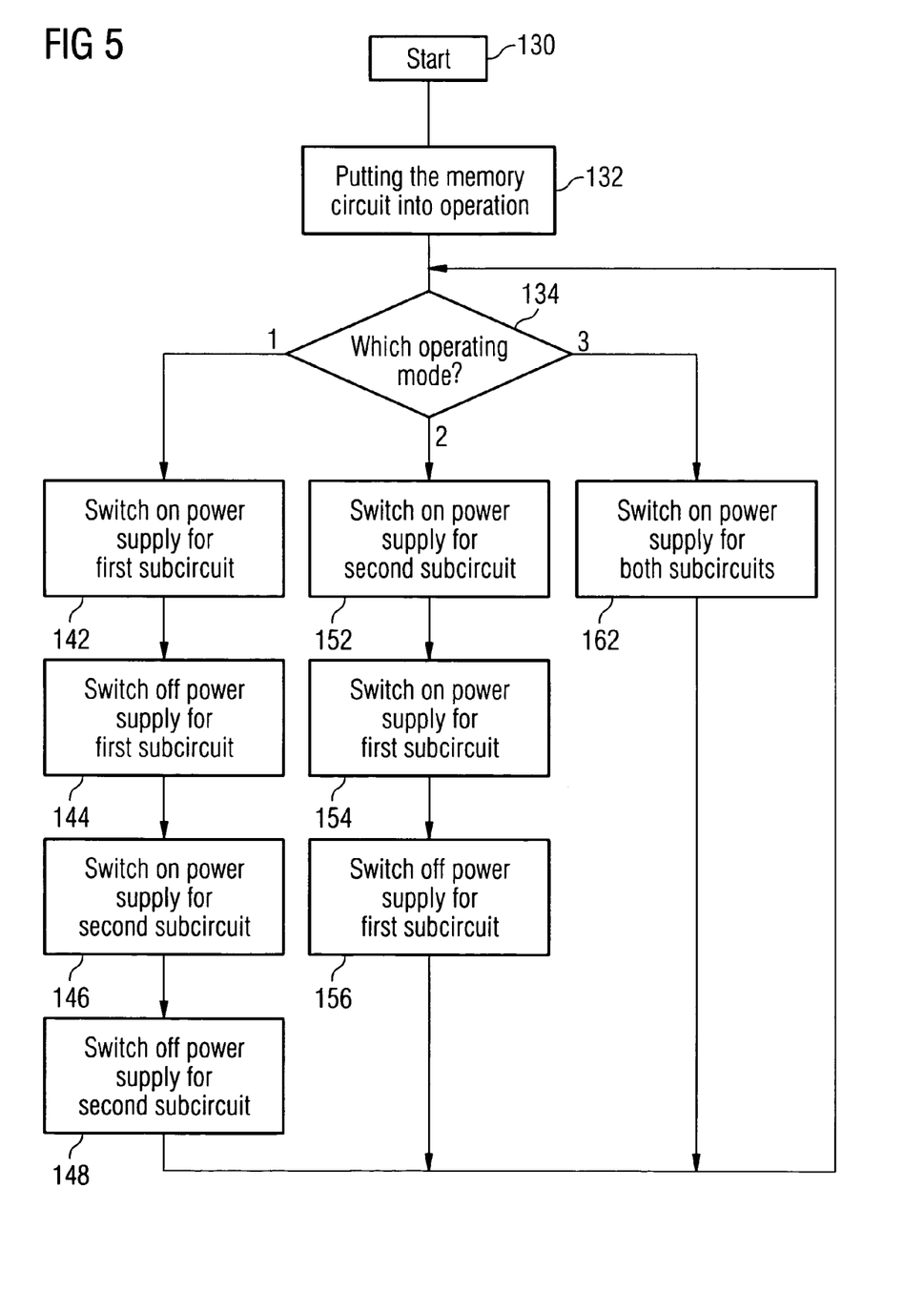
FIG. 5 shows a schematic flow diagram of a method in accordance with one exemplary embodiment of the present invention.

FIG. 5 is a schematic flow diagram illustrating a method according to one embodiment of the present invention such as is carried out, for example, by the semiconductor memory circuit illustrated above with reference to FIGS. 1 and 2 or under the control of the controller 28 of said semiconductor memory circuit. In this case, besides the active mode and the standby mode, a further standby mode is differentiated in which the second subcircuit 24 is continuously supplied with power, while the first subcircuit 22 is supplied with power in a clocked manner.

At the start (step 130), the power supply for the entire semiconductor memory circuit 10 is switched on. After the start 130, the semiconductor memory circuit is put into operation in a power-on sequence in a step 132. As has already been explained above, in this power-on sequence, all the standby voltage generators are continuously supplied with power to prevent interference during the run-up of the semiconductor memory circuit. A check is subsequently made in a step 134 to determine which operating mode is present. As already mentioned, three operating modes are possible in this exemplary embodiment.

A first operating mode (1) is a standby mode in which, in successive steps 142, 144, 146, 148, the power supply for a first subcircuit is switched on and off again after a predetermined first time duration and then the power supply for a second subcircuit is switched on and off again after a second predetermined time duration. A typical first predetermined time duration between steps 142 of switching on the power supply and 144 of switching off the power supply of the first subcircuit and between steps 146 and 148 of switching on and switching off the power supply for the second subcircuit is 3 µs, in each case. A typical time duration between steps 144 of switching off the power supply of the first subcircuit and 146 of switching on the power supply of the second subcircuit is 50 ns.

After step 148 of switching off the power supply of the second subcircuit, the method returns to step 134, wherein it is determined anew which operating mode is now present. As long as the standby mode is present, steps 142, 144, 146, 148 are repeated with a fixed period of 30 µs, by way of example. For this purpose, by way of example, step 134 can be executed at fixedly predetermined points in time, e.g., every 30 µs or, alternatively, be triggered by an external data access to the memory unit.

If, in step 134, it is ascertained that a further standby mode has been selected in which only the first subcircuit is supplied with power in a clocked manner but the second subcircuit is continuously supplied with power, the method firstly jumps to a step 152, in which the power supply for the second subcircuit is switched on. Afterward, the power supply for the first subcircuit is switched on in a step 154 and switched off after a predetermined time duration of once again 3 µs by way of example, in a step 156.

As long as the semiconductor memory circuit is in the further standby mode, steps 152, 154, 156 are repeated periodically, the period of the repetition once again being determined by the period of the predetermined points in time at which step 134 is executed. In this case, in a variant of the present exemplary embodiment, in step 152 of switching on the power supply for the second subcircuit, a check may be made to determine whether the power supply for the second subcircuit has already been switched on, in which case no further switch-on signal is generated.

If, in step 134, it is ascertained that an active operating mode of the semiconductor memory circuit 10 is present, the power supply for all the subcircuits is switched on in a step 162. This means, by way of example, that both standby voltage generators (for example, the first subcircuit 22 in FIG. 2) and voltage generators that are provided exclusively for the active operating mode (for example, the third subcircuit 26 in FIG. 2) as well as all other subcircuits (for example, the second subcircuit 24 in FIG. 2) are continuously supplied with power.

Even though, depending on the concrete realization of the semiconductor memory circuit 10 and its subcircuits, "switching on" a power supply for a subcircuit that is already being supplied with power is generally not disturbing. Each step of switching on the power supply for a subcircuit, in particular steps 152, 162, may alternatively comprise a step of checking whether the subcircuit is already being supplied with power and a step of switching on the power supply only when the subcircuit is not yet being supplied with power.

In the case of the exemplary embodiments illustrated above with reference to FIGS. 1 to 5, a standby mode, in each case, comprises two periodically repeated clock phases which do not overlap but rather are spaced apart temporally. Other subcircuits are supplied with electrical power in each clock phase. In accordance with a further exemplary embodiment, a third clock phase is further provided, which partly or completely overlaps the other two clock phases. This third clock phase may be used to control the power supply of subcircuits which themselves or whose downstream circuits require a longer preparation time. It is advantageous in terms of circuitry to form the third clock phase from the first two clock phases in such a way that it completely overlaps these two clock phases.

In a generalization of the exemplary embodiments above, according to the present invention, all subcircuits which need a supply current or consume supply power in a standby mode and thus contribute to the standby power budget are periodically switched on and off. To obtain a significant saving, the switch-on phase should be significantly smaller than the switch-off phase. The ratio of the two essentially determines the average power requirement. In particular, subcircuits which make a significant contribution to the power requirement and which themselves or whose subcircuits connected downstream are tolerant with respect to a ripple on their output voltage are supplied with power in a clocked manner. In this case, the power supply is clocked in such a way that internal potentials are maintained to the greatest possible extent even in switched-off subcircuits. This is achieved through capacitive storage at internal nodes of the subcircuits and particularly at their outputs. As a result, their output levels can further be used for regulation, and the transient recovery of the internal and external potentials is effected rapidly after the subcircuit is supplied with power again. As a result of clocking of the power supply of subcircuits that are connected downstream of one another with non-overlapping clock phases or else clock phases that overlap in a targeted manner, it is possible to avoid amplification of a ripple (for example, on a reference voltage) once it has arisen in potentials that are derived in subcircuits connected downstream.

In the context of the present invention, it is possible to provide a plurality of different standby modes with a different standby degree and a different power requirement which differ by the fact that the power supply of different groups of subcircuits is clocked. Furthermore, different standby modes may differ as a result of different clock ratios or as a result of different ratios between the first time duration, in which a subcircuit is supplied with power, and a second time duration, in which it is not supplied with power.

While the foregoing is directed to embodiments of the present invention, other and further embodiments of the invention may be devised without departing from the basic scope thereof, and the scope thereof is determined by the claims that follow.

What is claimed is:

1. A semiconductor memory circuit, comprising:
   a controller for switching the semiconductor memory circuit into a standby mode with a reduced power requirement;
   an analog subcircuit having a power input and a signal output;
   a switching device, for supplying electrical power, connected to the power input;
   a low-pass filter connected to the signal output of the analog subcircuit;

a further subcircuit having a further power input and a signal input connected to the output of the low-pass filter; and a further switching device connected to the power input of the further subcircuit, wherein the controller is connected to drive the switching device such that the switching device, in the standby mode, supplies the analog subcircuit with electrical power during a first periodically repeated time duration and does not supply the electrical power during a second periodically repeated time duration, and wherein the controller is configured and connected to drive the further switching device such that the further switching device, in the standby mode, supplies the further subcircuit with electrical power during a third periodically repeated time duration and does not supply electrical power during a fourth periodically repeated time duration.

2. The semiconductor memory circuit of claim 1, wherein
the power input of the analog subcircuit is connected to a reference potential via a first switch and to a supply potential via a second switch, and
the switching device comprises the first switch and the second switch which control periodically supplying of power.

3. The semiconductor memory circuit of claim 2, wherein
the power input of the analog subcircuit is connected to a further supply potential via a third switch, and
the switching device further comprises the third switch.

4. The semiconductor memory circuit of claim 3, wherein the second switch and the third switch comprise p-channel transistors arranged in an n-doped well connected to the supply potential.

5. The semiconductor memory circuit of claim 1, wherein the controller is further configured to control the switching device and the further switching device such that, in a further standby mode with a reduced power requirement, one of the analog subcircuit and the further subcircuit is continuously supplied with power.

6. The semiconductor memory circuit of claim 1, further comprising:
an oscillator for generating a time signal for controlling a refresh process for memory cells, wherein the controller is connected to the oscillator to receive the time signal from the oscillator to control the switching device in response to the time signal.

7. The semiconductor memory circuit of claim 1, wherein the controller is configured to control the switching device such that the analog subcircuit is continuously supplied with electrical power in a switch-on mode in which the circuit is put into operation.

8. The semiconductor memory circuit of claim 1, further comprising:
a third subcircuit having a third power input and a third signal output; and
a third switching device connected to the third power input of the third subcircuit for supplying electrical power to the third subcircuit,
wherein the controller is configured to control the switching device and the third switching device such that the third subcircuit is not supplied with power in the standby mode, and the analog subcircuit and the third subcircuit are supplied with electrical power in an active operating mode in which the semiconductor memory circuit operates in unrestricted fashion.

9. The semiconductor memory circuit of claim 1, wherein the analog subcircuit is a voltage generator.

10. A method for operating a semiconductor memory circuit having an analog subcircuit and a further subcircuit in a first standby mode with a reduced power requirement, comprising:
a) supplying the analog subcircuit with electrical power during a first time duration;
b) not supplying the analog subcircuit with electrical power during a second time duration;
c) supplying the further subcircuit with electrical power during a third time duration; and
d) not supplying the further subcircuit with electrical power during a fourth time duration,
wherein steps a), b), c) and d) are periodically repeated, and further comprising:
e) supplying the analog subcircuit with electrical power during a fifth time duration; and
f) not supplying the analog subcircuit with electrical power during a sixth time duration,
wherein steps e) and f) are periodically repeated during a second standby mode during which the further subcircuit is continuously supplied with electrical power.

11. The method of claim 10, wherein the first time duration and the third time duration do not overlap.

12. The method of claim 10, wherein the first time duration and the third time duration overlap.

13. The method of claim 10, wherein the first time duration is different in the second standby mode than in the first standby mode and the third time duration is different in the second standby mode than in the first standby mode.

14. The method of claim 10, wherein the analog subcircuit is continuously supplied with electrical power in a switch-on mode in which the semiconductor memory circuit is put into operation.

15. A semiconductor memory circuit, comprising:
a controller for switching the semiconductor memory circuit into a standby mode with a reduced power requirement;
a first analog subcircuit having a first power input and a signal output;
a second subcircuit having a second power input and a signal input connected to the signal output of the first subcircuit;
a first switching device connected to the first power input of the first subcircuit for supplying electrical power;
a second switching device connected to the second power input of the second subcircuit for supplying electrical power; and
wherein the controller is connected to the first switching device and to the second switching device such that the first switching device and the second switching device are driven by the controller in a manner clocked with a clock period such that the first switching device, in the standby mode, within each clock period, supplies the first analog subcircuit with electrical power during a first time duration and does not supply electrical power during a second time duration, and that the second switching device, in the standby mode, within each clock period, supplies the second subcircuit with electrical power during a third time duration and does not supply electrical power during a fourth time duration, and
wherein the controller is configured to control the switching devices such that at least one of:
the first time duration overlaps, at least partly, the fourth time duration; and
the second time duration overlaps, at least partly, the third time duration.

16. A method for operating a semiconductor memory circuit having a first analog subcircuit and a second subcircuit in a standby mode with a reduced power requirement, comprising:
   a) supplying the first analog subcircuit with electrical power during a first time duration;
   b) not supplying the first analog subcircuit with electrical power during a second time duration;
   c) supplying the second subcircuit with electrical power during a third time duration; and
   d) not supplying the second subcircuit with electrical power during a fourth time duration, wherein steps a), b), c) and d) are repeated with the same period, and wherein at least one of:

the first time duration overlaps, at least partly, the fourth time duration; and the second time duration overlaps, at least partly, the third time duration.

17. The method of claim 16, wherein the first time duration and the third time duration do not overlap.

* * * * *